United States Patent
Khlat et al.

(10) Patent No.: US 12,490,661 B2
(45) Date of Patent: Dec. 2, 2025

(54) CONTROL METHOD FOR SWITCHES BASED ON DUAL PHASE MATERIALS

(71) Applicant: Qorvo US, Inc., Greensboro, NC (US)

(72) Inventors: Nadim Khlat, Cugnaux (FR); Julio C. Costa, Oak Ridge, NC (US)

(73) Assignee: Qorvo US, Inc., Greensboro, NC (US)

(*) Notice: Subject to any disclaimer, the term of this patent is extended or adjusted under 35 U.S.C. 154(b) by 450 days.

(21) Appl. No.: 18/040,227

(22) PCT Filed: Aug. 5, 2021

(86) PCT No.: PCT/US2021/044683
§ 371 (c)(1),
(2) Date: Feb. 1, 2023

(87) PCT Pub. No.: WO2022/031933
PCT Pub. Date: Feb. 10, 2022

(65) Prior Publication Data
US 2023/0270023 A1    Aug. 24, 2023

Related U.S. Application Data

(60) Provisional application No. 63/061,297, filed on Aug. 5, 2020.

(51) Int. Cl.
*H10N 70/00* (2023.01)
*H10N 70/20* (2023.01)
*H10N 79/00* (2023.01)

(52) U.S. Cl.
CPC ....... *H10N 70/8613* (2023.02); *H10N 70/231* (2023.02); *H10N 70/8828* (2023.02); *H10N 79/00* (2023.02)

(58) Field of Classification Search
None
See application file for complete search history.

(56) References Cited

U.S. PATENT DOCUMENTS 6,239,502 B1    5/2001  Grewe et al.
11,936,374 B1 *  3/2024  Dykstra ............. G11C 13/0004
(Continued)

OTHER PUBLICATIONS

International Search Report and Written Opinion for PCT/US2021/044683, mailed Nov. 29, 2021, 11 pages.

*Primary Examiner* — Cassandra F Cox
(74) *Attorney, Agent, or Firm* — Withrow & Terranova, P.L.L.C.

(57) ABSTRACT

The present disclosure relates to a switch system that provides a control method for switches based on dual-phase materials. The disclosed switch system includes a heat resistor, a power management (PM) unit configured to provide a control voltage at a voltage port coupled to the heat resistor, and a phase-change-based switch. Herein, the heat resistor is underneath the phase-change-based switch, and configured to generate heat energy from the control voltage and provide the heat energy to the phase-change-based switch. The phase-change-based switch is capable of being switched on and off by switching between a crystalline phase and an amorphous phase based on the heat energy provided by the heat resistor. The control voltage provided by the PM unit contains waveform information of target heat energy required for switching on and off the phase-change-based switch.

35 Claims, 6 Drawing Sheets

(56) References Cited

U.S. PATENT DOCUMENTS

2009/0261313 A1 10/2009 Lung et al.
2010/0258777 A1 10/2010 Li
2016/0036100 A1 2/2016 Wang et al.

* cited by examiner

CONTROL METHOD FOR SWITCHES BASED ON DUAL PHASE MATERIALS

RELATED APPLICATIONS

This application is a 35 USC 371 national phase filing of International Application No. PCT/US2021/044683, filed Aug. 5, 2021, which claims the benefit of U.S. provisional patent application Ser. No. 63/061,297, filed Aug. 5, 2020, the disclosures of which are incorporated herein by reference in their entireties.

FIELD OF THE DISCLOSURE

The technology of the disclosure relates to a switch system that provides a control method for one or more switches based on dual phase materials.

BACKGROUND

A dual phase material refers to a chemical material that is capable of existing in both amorphous and crystalline phases. As illustrated in FIG. 1, when the dual phase material is in the amorphous phase, it has a high resistance, and when the dual phase material is in the crystalline phase, it has a low resistance. Chalcogenide has been demonstrated as a dual phase material and can reach a resistance change greater than 20,000,000:1 between the amorphous phase and the crystalline phase. In particular, the resistance of sulfides, tellurides, or selenides can increase/decrease more than 1 trillion times due to phase changes.

Due to the superior resistance change of the chalcogenides caused by the phase changes, chalcogenides have recently attracted more and more attention in switch device applications. The amorphous phase of the chalcogenides may achieve an OFF-state of a switch, and the crystalline phase of the chalcogenides may achieve an ON-state of the switch.

Typically, fast bursts of heating are required for local crystallization (i.e., melting) or amorphization of the dual phase material. For instance, germanium telluride (GeTe) may be cycled between a high resistance and a low resistance by heating pulses to cause it to essentially melt at 750-900° C. However, the heating energy requirements for efficient switching operations of chalcogenide devices are challenging. For each switching operation, the required heating energy may only exist for a very short pulse period but needs to sufficiently heat the chalcogenide devices.

Accordingly, there is a need for designing a switch system that can utilize chalcogenides in switch devices and provide power management techniques to generate sufficient heat for the switch devices in a very short pulse period.

SUMMARY

The present disclosure relates to a switch system that provides a control method for switches based on dual-phase materials. The disclosed switch system includes a heat resistor, a power management (PM) unit configured to provide a control voltage at a voltage port coupled to the heat resistor, and a phase-change-based switch. Herein, the heat resistor is underneath the phase-change-based switch and configured to generate heat energy from the control voltage and provide the heat energy to the phase-change-based switch. The phase-change-based switch is capable of being switched on and off by switching between a crystalline phase and an amorphous phase based on the heat energy provided by the heat resistor. The control voltage provided by the PM unit contains waveform information of target heat energy required for switching on and off the phase-change-based switch.

According to one embodiment, the switch system further includes a multiplexer (MUX), which is configured to select either a first ramp waveform or a second ramp waveform as a target voltage. Herein, the target voltage is provided to the PM unit, and the control voltage is provided based on the target voltage. The first ramp waveform corresponds to switching on the phase-change-based switch and contains the waveform information of the target heat energy required for switching on the phase-change-based switch. The second ramp waveform corresponds to switching off the phase-change-based switch and contains the waveform information of the target heat energy required for switching off the phase-change-based switch.

In one embodiment of the switch system, the PM unit includes a tracking amplifier, a control unit, a multi-level voltage converter, and a power inductor. Herein, the tracking amplifier is configured to receive the target voltage and configured to generate a tracked voltage based on the target voltage. The control voltage is related to the tracked voltage. The multi-level voltage converter includes a multi-level charge pump (CP) and a CP switch structure coupled between the multi-level CP and the power inductor. The multi-level CP is configured to receive a battery voltage and generate a boosted voltage higher than the battery voltage. The control unit is configured to control a value of the boosted voltage generated by the multi-level CP, and configured to control the CP switch structure to provide the boosted voltage from the multi-level CP, the battery voltage, or zero voltage to the power inductor. The power inductor is coupled between the CP switch structure of the multi-level voltage converter and the voltage port.

In one embodiment of the switch system, the control unit is one of a group consisting of a microprocessor, a microcontroller, a digital signal processor (DSP), and a field programmable gate array (FPGA).

In one embodiment of the switch system, the PM unit further includes an offset capacitor, which is coupled between the tracking amplifier and the voltage port. The control voltage at the voltage port is equal to a summation of the tracked voltage generated by the tracking amplifier and an offset voltage across the offset capacitor.

In one embodiment of the switch system, the control unit is configured to control the multi-level CP by comparing the tracked voltage from the tracking amplifier and the control voltage at the voltage port.

In one embodiment of the switch system, the boosted voltage is equal to up to three times the battery voltage, the offset voltage is equal to up to two times the battery voltage.

In one embodiment of the switch system, the tracking amplifier is powered by the boosted voltage. The control voltage is capable of having a maximum value up to five times the battery voltage.

In one embodiment of the switch system, the at least one phase-change-based switch is formed from a chalcogenide material.

In one embodiment of the switch system, the at least one phase-change-based switch is formed from germanium-antimony-tellurium, germanium-tellurium, or antimony-tellurium.

In one embodiment of the switch system, the at least one phase-change-based switch at the crystalline phase has a first impedance, and the at least one phase-change-based switch at the amorphous phase has a second impedance. The second impedance is at least 20,000,000 times larger than the first impedance.

In one embodiment of the switch system, the at least one heat resistor is formed of tungsten, and the at least one heat resistor has a width between 1 µm and 5 µm and a length between 2 µm and 10 µm.

According to one embodiment, the switch system further includes a number of field-effect transistor (FET) based switches. Herein, the at least one heat resistor includes a number of heat resistors, and the at least one phase-change-based switch includes a number of phase-change-based switches. Each heat resistor is underneath a corresponding phase-change-based switch, and configured to generate heat energy from the control voltage and provide the heat energy to the corresponding phase-change-based switch. The FET based switches are configured to selectively provide the control voltage to certain ones of the heat resistors.

In one embodiment of the switch system, each FET based switch is coupled in series with a corresponding heat resistor.

In one embodiment of the switch system, each FET based switch is a P-channel FET (PFET) based switch and coupled between the voltage port and a corresponding heat resistor.

In one embodiment of the switch system, each FET based switch is a N-channel FET (NFET) based switch and coupled between a corresponding heat resistor and ground.

According to one embodiment, the switch system further includes a serial bus (SuBUS), which is configured to program when to close or open certain ones of the plurality of FET based switches.

In one embodiment of the switch system, each waveform of the target heat energy required for switching on or off the at least one phase-change-based switch has a duration of 0.5 µs to 2 µs.

According to one embodiment, an alternative switch system includes at least one heat resistor, a non-variable PM unit, at least one phase-change-based switch, and at least one NFET based switch. The non-variable PM unit is configured to provide a control voltage at a voltage port that is coupled to the at least one heat resistor. The control voltage is fixed over time. The at least one heat resistor is underneath the at least one phase-change-based switch, and configured to generate heat energy from the control voltage and provide the heat energy to the at least one phase-change-based switch. The at least one phase-change-based switch is capable of being switched on and off by switching between a crystalline phase and an amorphous phase based on the heat energy provided by the at least one heat resistor. The at least one NFET based switch is coupled between the at least one heat resister and ground. A gate of the at least one NFET based switch is controlled by a gate control voltage, which contains waveform information of target heat energy required for switching on and off the at least one phase-change-based switch.

According to one embodiment, the alternative switch system further includes at least one MUX, which is configured to select either a first ramp waveform or a second ramp waveform as the gate control voltage. Herein, the first ramp waveform corresponds to switching on the phase-change-based switch, and contains the waveform information of the target heat energy required for switching on the phase-change-based switch. The second ramp waveform corresponds to switching off the phase-change-based switch, and contains the waveform information of the target heat energy required for switching off the phase-change-based switch.

In one embodiment of the alternative switch system, the non-variable PM unit includes a control unit, a multi-level voltage converter, and a power inductor. Herein, the multi-level voltage converter includes a multi-level CP configured to receive a battery voltage and generate a boosted voltage higher than the battery voltage, and a CP switch structure coupled between the multi-level CP and the power inductor. The control unit is configured to control a value of the boosted voltage generated by the multi-level CP, and configured to control the CP switch structure to provide the boosted voltage from the multi-level CP, the battery voltage, or zero voltage to the power inductor. The power inductor is coupled between the CP switch structure of the multi-level voltage converter and the voltage port.

In one embodiment of the alternative switch system, the control unit is one of a group consisting of a microprocessor, a microcontroller, a DSP, a field FPGA, and a pulse-width modulation (PWM) analog circuit controller.

In one embodiment of the alternative switch system, the non-variable PM unit further comprises an offset capacitor coupled between the voltage port and ground.

In one embodiment of the alternative switch system, the control unit is configured to control the multi-level CP depending on the control voltage at the voltage port.

In one embodiment of the alternative switch system, the boosted voltage is equal to up to three times the battery voltage, and the control voltage is equal to up to three times the battery voltage.

In one embodiment of the alternative switch system, the at least one phase-change-based switch is formed from a chalcogenide material.

In one embodiment of the alternative switch system, the at least one phase-change-based switch is formed from germanium-antimony-tellurium, germanium-tellurium, or antimony-tellurium.

In one embodiment of the alternative switch system, the phase-change-based switch at the crystalline phase has a first impedance, and the phase-change-based switch at the amorphous phase has a second impedance. The second impedance is at least 20,000,000 times larger than the first impedance.

In one embodiment of the alternative switch system, the at least one heat resistor is formed of tungsten, and the at least one heat resistor has a width between 1 µm and 5 µm and a length between 2 µm and 10 µm.

In one embodiment of the alternative switch system, the at least one heat resistor includes a number of heat resistors, the at least one phase-change-based switch includes a number of phase-change-based switches, and the at least one NFET based switch includes a number of NFET based switches. Herein, each heat resistor is underneath a corresponding phase-change-based switch, and configured to generate heat energy from the control voltage and provide the heat energy to the corresponding phase-change-based switch. Each NFET based switch is coupled between a corresponding heat resistor and ground. A gate of each NFET based switch is controlled by a corresponding gate control voltage, such that a resistance value of each NFET based switch is controlled. Each gate control voltage contains waveform information of target heat energy required for switching on and off the corresponding phase-change-based switch.

According to one embodiment, the alternative switch system further includes a number of MUXs, each of which is configured to provide one gate control voltage for each NFET based switch. Herein, each gate control voltage is selected from a corresponding ramp waveform pair, and each ramp waveform pair contains waveform information of the target heat energy required for switching on and switching off the corresponding phase-change-based switch.

In one embodiment of the alternative switch system, the ramp waveform pair corresponding to each phase-change-based switch is the same.

In one embodiment of the alternative switch system, the ramp waveform pair corresponding to each phase-change-based switch is the different.

In one embodiment of the alternative switch system, the phase-change-based switches are capable of performing different switching operations at a same time.

According to one embodiment, the alternative switch system further includes a SuBUS, which is configured to program each MUX to determine when a certain ramp waveform is selected as a corresponding gate control voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 1:
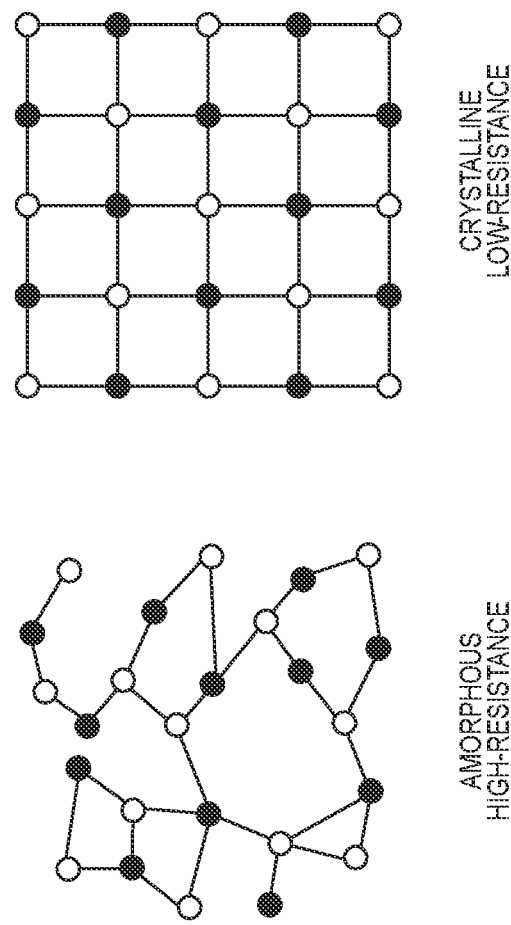
FIG. 1 illustrates a dual phase material at an amorphous phase and a crystalline phase.

It will be understood that for clear illustrations, FIGS. 1-6 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
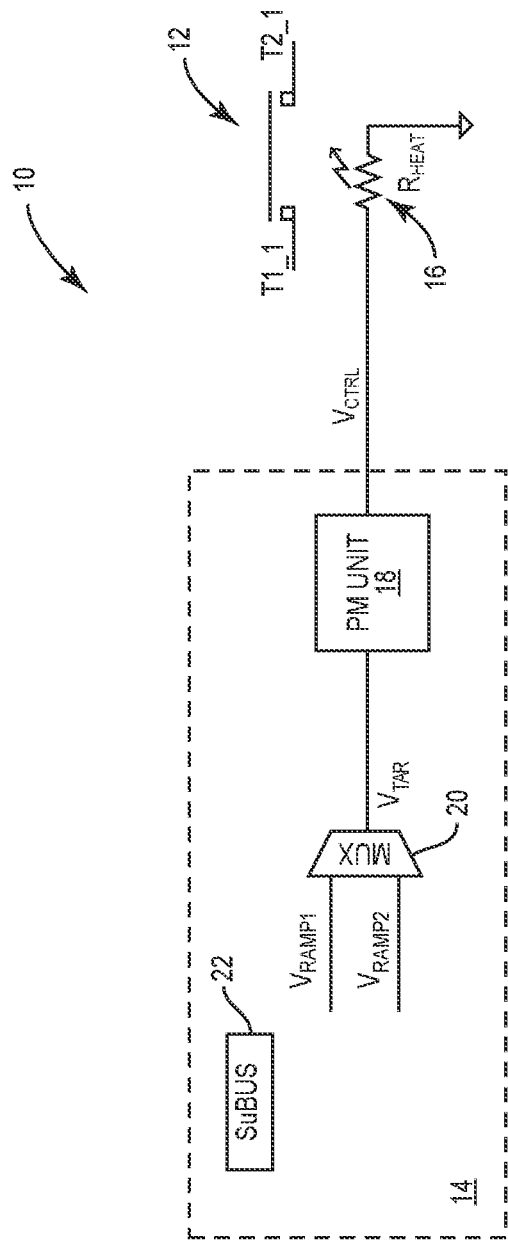
FIG. 2 illustrates an exemplary switch system with a switch controller, which controls a switch based on a dual phase material, according to an embodiment of the present disclosure.

The present disclosure relates to a switch system that performs a control method for one or more switches based on dual phase materials. FIG. 2 illustrates an exemplary switch system 10 including a phase-change-based switch 12, a switch controller 14, and a heat resistor 16 with a resistance $R_{HEAT}$ according to an embodiment of the present disclosure. Herein, the phase-change-based switch 12 is a two-terminal (e.g., a first terminal T1_1 and a second terminal T2_1) switch, and may be formed from a chalcogenide material (e.g., germanium-antimony-tellurium, germanium-tellurium, or antimony-tellurium). The phase-change-based switch 12 is capable of achieving a radio frequency (RF) switching speed with a low insertion loss by utilizing heat energy with proper waveforms. At an "ON" state (i.e., at the crystalline phase), the phase-change-based switch 12 has a superior low impedance between the first terminal T1_1 and the second terminal T2_1, while at an "OFF" state (i.e., at the amorphous phase), the phase-change-based switch 12 has a superior high impedance between the first terminal T1_1 and the second terminal T2_1. In an unlimited example, the high impedance at the amorphous phase is at least 20,000,000 times greater than the low impedance at the crystalline phase. The phase-change-based switch 12 is connected to external circuitry (not shown) via the first terminal T1_1 and the second terminal T2_1.

The switch controller 14 is configured to provide electrical energy (i.e., a control voltage $V_{CTRL}$) to the heat resistor 16, so as to close or open the phase-change-based switch 12. In detail, the switch controller 14 includes a power management (PM) unit 18 and a multiplexer (MUX) 20. The PM unit 18 is configured to provide the control voltage $V_{CTRL}$ to the heat resistor 16 based on two ramp waveforms (i.e., a first ramp waveform $V_{RAMP1}$ and a second ramp waveform $V_{RAMP2}$). Herein, the first ramp waveform $V_{RAMP1}$ corresponds to switching from the "OFF" state to the "ON" state (i.e., from the amorphous state to the crystalline phase) of the phase-change-based switch 12, and the second ramp waveform $V_{RAMP2}$ corresponds to switching from the "ON" state to the "OFF" state (i.e., from the crystalline phase to the amorphous phase) of the phase-change-based switch 12. The MUX 20 is configured to select either the first ramp waveform $V_{RAMP1}$ or the second ramp waveform $V_{RAMP2}$ for the PM unit 18 depending on switching on or switching off the phase-change-based switch 12, respectively.

The heat resistor 16 is placed underneath the phase-change-based switch 12, particularly underneath the chalcogenide portion of the phase-change-based switch 12. The heat resistor 16 may be formed of tungsten and may have a width between 1 μm and 5 μm and a length between 2 μm and 10 μm. The heat resistor 16 is configured to transfer the electrical energy to heat energy and configured to provide the heat energy to the phase-change-based switch 12. The heat energy provided by the heat resistor 16 is about equal to $V_{CTRL}^2/R_{HEAT}$. As such, waveform requirements of target heat energy for switching on and switching off the phase-change-based switch 12 can be achieved by adjusting waveforms of the control voltage $V_{CTRL}$. Typically, a waveform of target heat energy required for switching on the phase-change-based switch 12 and a waveform of target heat energy required for switching off the phase-change-based switch 12 may have different amplitudes and/or different durations. Each waveform required for switching on or off the phase-change-based switch 12 may have a duration of 0.5 μs to 2 μs.

The first ramp waveform $V_{RAMP1}$ contains waveform information of the target heat energy required for switching on the phase-change-based switch 12, and the second ramp waveform $V_{RAMP2}$ contains waveform information of the target heat energy required for switching off the phase-change-based switch 12. Since the waveforms of the target heat energy required for switching on and switching off the phase-change-based switch 12 might be different in amplitudes and/or durations, the first ramp waveform $V_{RAMP1}$ and the second ramp waveform $V_{RAMP2}$ may also be different in amplitudes and/or durations.

In some applications, the switch controller 14 may further include a serial bus (SuBUS) 22, which is configured to provide programmability to the switch controller 14 via a serial interface. The SuBUS 22 might be a single-wire bus.

Figure 3:
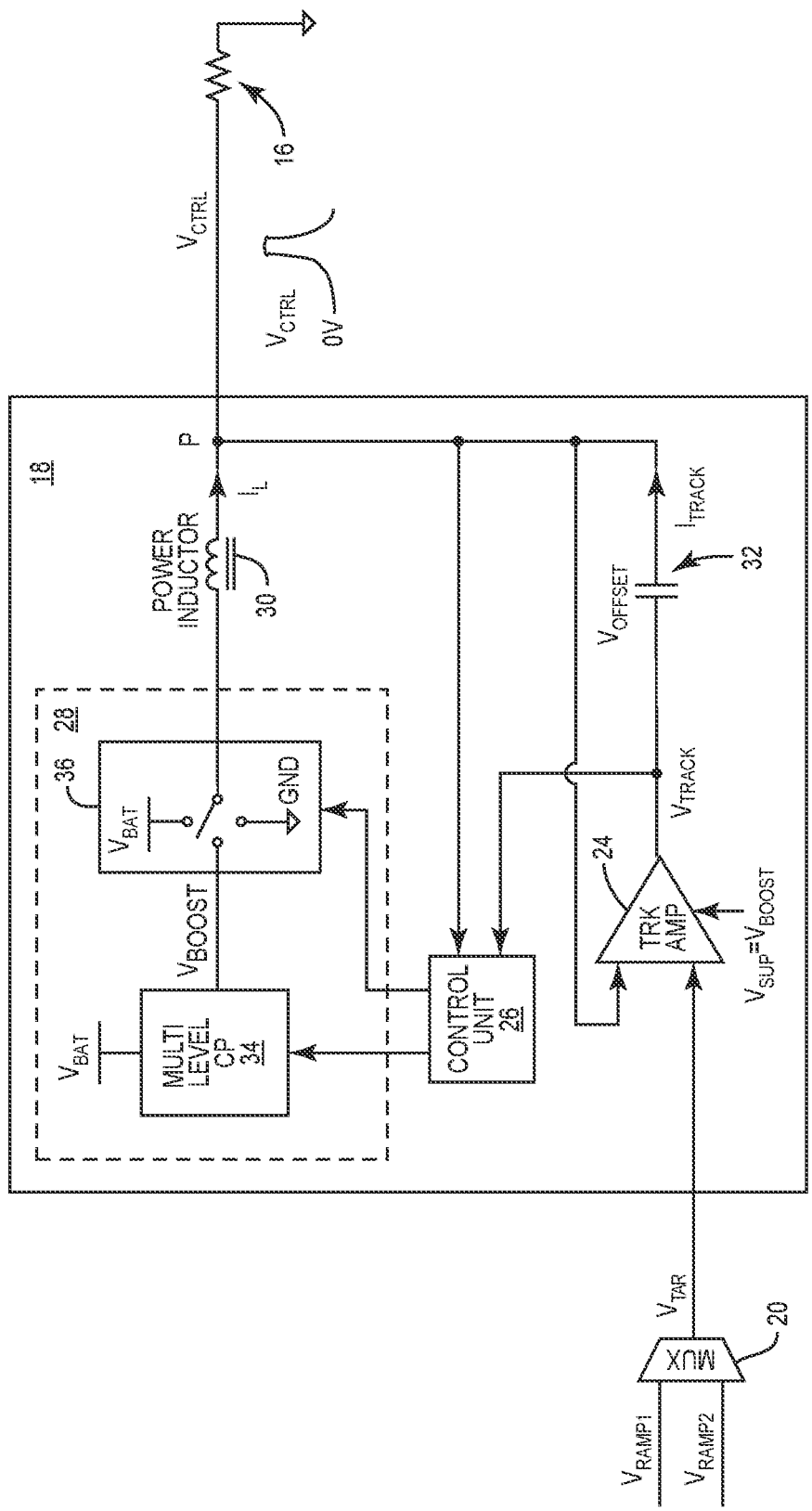
FIG. 3 illustrates a power management (PM) unit in the switch controller shown in FIG. 2.

FIG. 3 illustrates details of the PM unit 18 in the switch controller 14 shown in FIG. 2. The PM unit 18 includes a tracking amplifier 24, a control unit 26, a multi-level voltage converter 28, and a power inductor 30. In detail, the tracking amplifier 24 is configured to receive a target voltage $V_{TAR}$, which is selected by the MUX 20 from the first ramp waveform $V_{RAMP1}$ and the second ramp waveform $V_{RAMP2}$. In addition, the tracking amplifier 24 receives a supply voltage $V_{SUP}$ as a power supply, and is configured to provide a tracked voltage $V_{TRACK}$ by tracking the target voltage $V_{TAR}$. The supply voltage $V_{SUP}$ is no smaller than the target voltage $V_{TAR}$ over time to ensure proper operation of the tracking amplifier 24. As such, the supply voltage $V_{SUP}$ is no smaller than the tracked voltage $V_{TRACK}$, which tracks the target voltage $V_{TAR}$. In a non-limiting example, the tracking amplifier 24 is coupled to a voltage port P via an offset capacitor 32, where the voltage port P is electrically connected to the heat resistor 16 and the control voltage $V_{CTRL}$ is provided at the voltage port P. The offset capacitor 32 is configured to provide an offset voltage $V_{OFFSET}$. The offset voltage $V_{OFFSET}$, which may be precharged, may help raise the tracked voltage $V_{TRACK}$ to the control voltage $V_{CTRL}$ ($V_{CTRL}=V_{TRACK}+V_{OFFSET}$) at the voltage port P, thus helping to lower the supply voltage $V_{SUP}$ required by the tracking amplifier 24 to improve power efficiency in the PM unit 18.

If the tracking amplifier 24 is coupled directly to the voltage port P without the offset capacitor 32, then the control voltage $V_{CTRL}$ will be the same as the tracked voltage $V_{TRACK}$. In this regard, if a maximum value of the control voltage $V_{CTRL}$ at the voltage port P is required to be 5 V for example, the tracked voltage $V_{TRACK}$ produced by the tracking amplifier 24 will also be 5 V. Accordingly, the supply voltage $V_{SUP}$ needs to be at least 5 V. In contrast, if the tracking amplifier 24 is coupled to the voltage port P via the offset capacitor 32 that provides the 2 V offset voltage $V_{OFFSET}$, then the tracking amplifier 24 would only need to produce the tracked voltage $V_{TRACK}$ at 3 V. As a result, the supply voltage $V_{SUP}$ may be reduced to 3 V as well, thus helping improve power efficiency in the PM unit 18.

In addition, the tracking amplifier 24 sources a tracked current $I_{TRACK}$ to the voltage port P through the offset capacitor 32. Since the offset capacitor 32 may block direct current (DC) and/or low-frequency alternate current (AC), the tracked current $I_{TRACK}$ from the tracking amplifier 24 to the voltage port P may include middle and/or high frequency AC portions. As such, the tracking amplifier 24 may provide middle and/or high frequency energy to the voltage port P.

Notice that the control voltage $V_{CTRL}$ is based on the target voltage $V_{TAR}$ (i.e., one of the first ramp waveform $V_{RAMP1}$ and the second ramp waveform $V_{RAMP2}$), which contains the waveform information of the target heat energy required for switching on/off the phase-change-based switch 12. Therefore, the control voltage $V_{CTRL}$ also contains the waveform information of the target heat energy for switching on/off the phase-change-based switch 12. By adjusting the target voltage $V_{TAR}$, and consequently adjusting the control voltage $V_{CTRL}$, the waveform requirements for switching on/off the phase-change-based switch 12 can be achieved, and thus the phase-change-based switch 12 is capable of operating properly.

The control unit 26 may be a microprocessor, a microcontroller, a digital signal processor (DSP), or a field programmable gate array (FPGA), for example. The multi-level voltage converter 28 includes a multi-level charge pump (CP) 34 and a CP switch structure 36. Herein, the multi-level CP 34 is configured to provide a boosted voltage $V_{BOOST}$ based on a battery voltage $V_{BAT}$, and the CP switch structure 36 is configured to selectively output the boosted voltage $V_{BOOST}$ from the multi-level CP 34, the battery voltage $V_{BAT}$, or zero voltage to the power inductor 30.

Comparing the tracked voltage $V_{TRACK}$ from the tracking amplifier 24 and the control voltage $V_{CTRL}$ at the voltage port P (representing that the offset capacitor 32 needs to be charged or discharged), the control unit 26 may be configured to control duty cycles of the multi-level CP 34 to change the value of the boosted voltage $V_{BOOST}$. Typically, the boosted voltage $V_{BOOST}$ is higher than the battery voltage $V_{BAT}$. In a non-limiting example, the boosted voltage $V_{BOOST}$ may be equal to two times or three times of the battery voltage $V_{BAT}$ ($V_{BOOST}=2V_{BAT}/3V_{BAT}$)

The CP switch structure 36 is coupled between the multi-level CP 34 and the power inductor 30. In a non-limiting example, the CP switch structure 36 includes a single-pole three-throw (SP3T) switch, which is controlled by the control unit 26 to selectively connect to the multi-level CP 34, the battery voltage $V_{BAT}$, or ground. As such, the CP switch structure 36 selectively outputs the boosted voltage $V_{BOOST}$ from the multi-level CP 34, the battery voltage $V_{BAT}$, or zero voltage from ground to the power inductor 30. Notably, the CP switch structure 34 may be implemented by any number, type, and layout of switches without affecting functionalities of the CP switch structure 36.

The power inductor 30 is coupled between the CP switch structure 36 of the multi-level voltage converter 28 and the voltage port P. The voltage outputted by the CP switch structure 36 causes the power inductor 30 to induce an output current $I_L$ toward the voltage port P. As such, the control unit 26 is configured to control (e.g., increase/decrease) the output current $I_L$ to the voltage port P. Herein, since the power inductor 30 may block middle and/or high frequency AC, the output current $I_L$ from the power inductor 30 may include DC and/or low frequency AC portions. Therefore, the multi-level voltage converter 28 and the power inductor 30 may provide low frequency energy to the voltage port P.

In one embodiment, the boosted voltage $V_{BOOST}$ generated from the multi-level CP 34 is applied as the supply voltage $V_{SUP}$ of the tracking amplifier 24. Therefore, the maximum value of the target voltage $V_{TAR}$ and consequently, the tracked voltage $V_{TRACK}$ is the boosted voltage $V_{BOOST}$. Furthermore, the maximum value of the control voltage $V_{CTRL}$ is $V_{BOOST}+V_{OFFSET}$. If the $V_{BOOST}$ can achieve up to $3*V_{BAT}$, and the $V_{OFFSET}$ can be charged up to $2*V_{BAT}$, the control voltage $V_{CTRL}$ can reach as high as $5*V_{BAT}$. As such, even with a low battery voltage $V_{BAT}$ (e.g., 2.5V), a large transient peak power (e.g., 12-20 Watts) can still be delivered to the phase-change-based switch 12 during a short pulse period (e.g., 0.5 μs to 2 μs).

Figure 4:
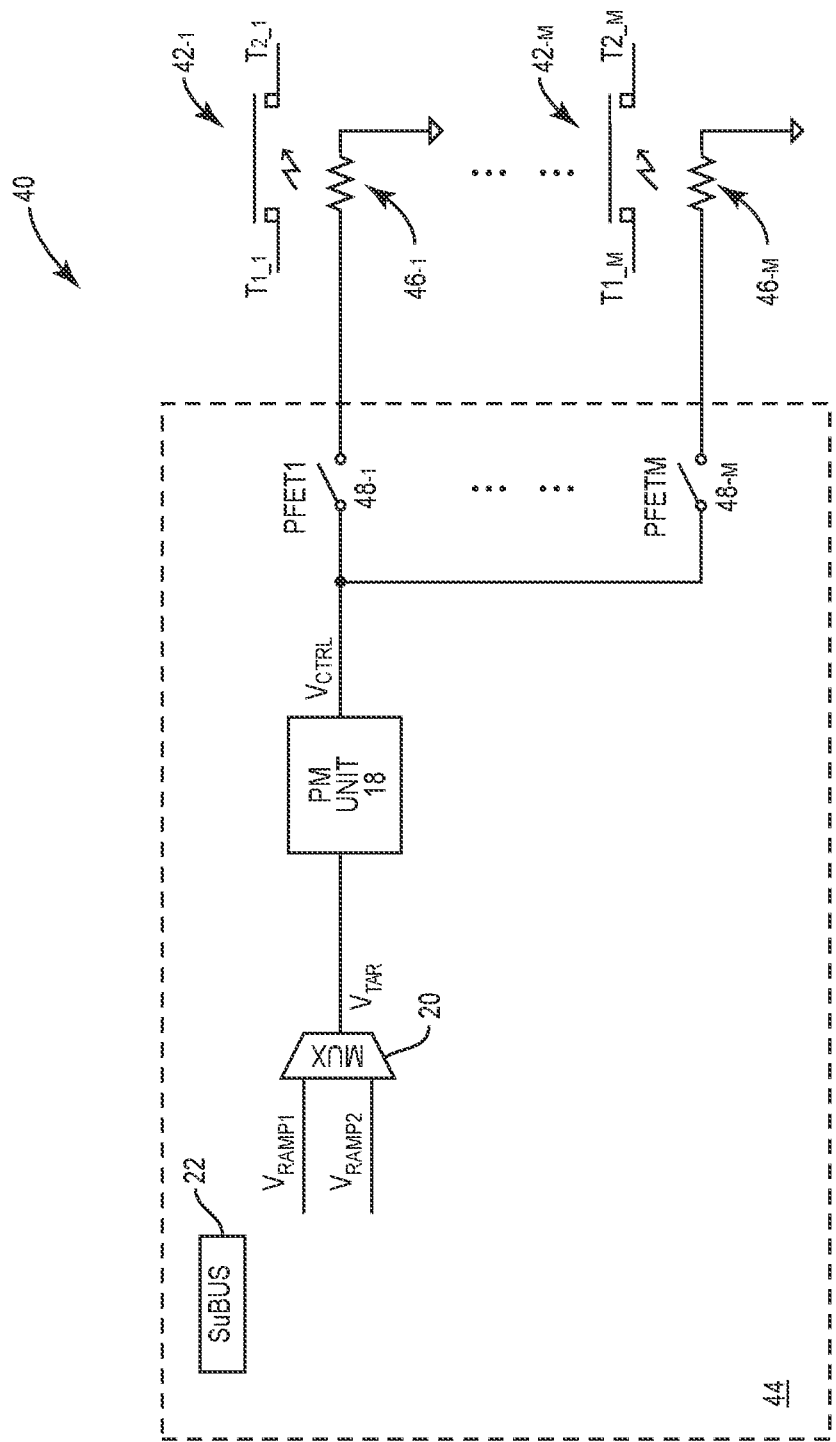
FIG. 4 illustrates an exemplary switch system with a switch controller, which controls a number of switches, each based on a dual phase material, according to an embodiment of the present disclosure.

In some applications, a switch system may provide a control method for multiple phase-change-based switches. FIG. 4 illustrates an exemplary switch system 40 including a number of phase-change-based switches 42 (e.g., a first phase-change-based switch 42_1, . . . , and a $M^{th}$ phase-change-based switch 42_M), a switch controller 44, and a number of heat resistors 46 (e.g., a first heat resistor 46_1, . . . , and a $M^{th}$ heat resistor 46_M) according to an embodiment of the present disclosure. Herein, each phase-change-based switch 42 is a two-terminal (e.g., a corresponding first terminal T1_# and a corresponding second terminal T2_#) switch, and is formed from a chalcogenide material (e.g., germanium-antimony-tellurium, germanium-tellurium, or antimony-tellurium). Each phase-change-based switch 42 is capable of achieving a RF switching speed with a low insertion loss by utilizing heat energy with proper waveforms. At an "ON" state (i.e., at the crystalline phase), each phase-change-based switch 42 has a superior low impedance between the first terminal T1_# and the second terminal T2_#, while at an "OFF" state (i.e., at the amorphous phase), each phase-change-based switch 42 has a superior high impedance between the first terminal T1_# and the second terminal T2_#. Each phase-change-based switch 42 is connected to external circuitry (not shown) via the first terminal T1_# and the second terminal T2_#.

Each heat resistor 46 is placed underneath a corresponding phase-change-based switch 42. Each heat resistor 46 is configured to transfer electrical energy (i.e., the control voltage $V_{CTRL}$) to heat energy and provide the heat energy to the corresponding phase-change-based switch 42. Each heat resistor 46 may be formed of tungsten and may have a width between 1 μm and 5 μm and a length between 2 μm and 10 μm.

The switch controller 44 is configured to provide electrical energy (i.e., the control voltage $V_{CTRL}$) to the heat resistors 46, so as to close or open the phase-change-based switch 42. Similar as the switch controller 14, the switch controller 44 also includes the PM unit 18 and the MUX 20. Besides, the switch controller 44 further includes a number of P-channel field-effect transistor (PFET) based switches 48 (e.g., a first PFET based switch 48_1, . . . , and a $M^{th}$ PFET based switch 48_M), each of which is coupled between the PM unit 18 and a corresponding heat resistor 46. The PFET based switches 48 are configured to selectively provide the control voltage $V_{CTRL}$ to the heat resistors 46. As such, each heat resistor 46 can be heated simultaneously or alone by the control voltage $V_{CTRL}$, and consequently, the corresponding phase-change-based switch 42 can switch on/off simultaneously or alone.

Figure 5:
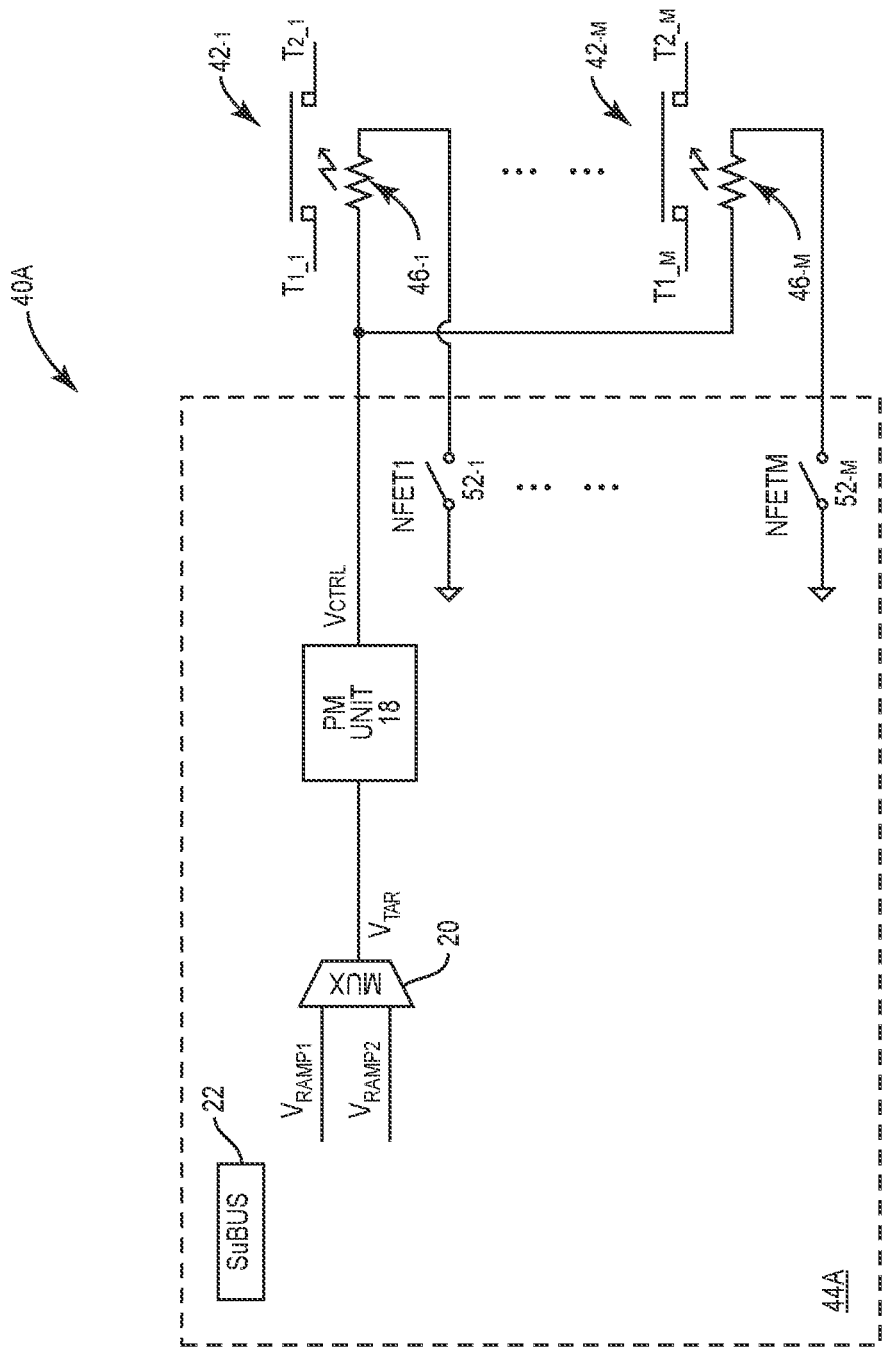
FIG. 5 illustrates an alternative switch system with a switch controller, which controls a number of switches, each based on a dual phase material, according to an embodiment of the present disclosure.

FIG. 5 illustrates an alternative switch system 40A with an alternative switch controller 44A. Compared to the switch controller 44, the alternative switch controller 44A utilizes a number of N-channel FET (NFET) based switches 52 (e.g., a first NFET based switch 52_1, . . . , and a $M^{th}$ NFET based switch 52_M) instead of PFET based switches 48 to selectively provide the control voltage $V_{CTRL}$ to the heat resistors 46. In the alternative switch controller 44A, each heat resistor 46 is directly connected to the PM unit 18, and each NFET based switch 52 is coupled between a corresponding heat resistor 46 and ground. As such, each heat resistor 46 can be heated simultaneously or alone by the control voltage $V_{CTRL}$, and consequently, the corresponding phase-change-based switch 42 can switch on/off simultaneously or alone.

As illustrated in FIGS. 4 and 5, the PFET based switches 48/the NFET based switches 52 are included in the switch controller 44/44A, and can be programmed by the SuBUS 22 (e.g., programming when to close certain PFET based switch(es)/certain NFET based switch(es)). In some applications, the PFET based switches 48/the NFET based switches 52 may not be included in the switch controller 44/44A and not controlled by the SuBUS 22 (e.g., fabricating the PFET based switches 48/the NFET based switches 52 simultaneously with the phase-change-based switch 42).

Figure 6:
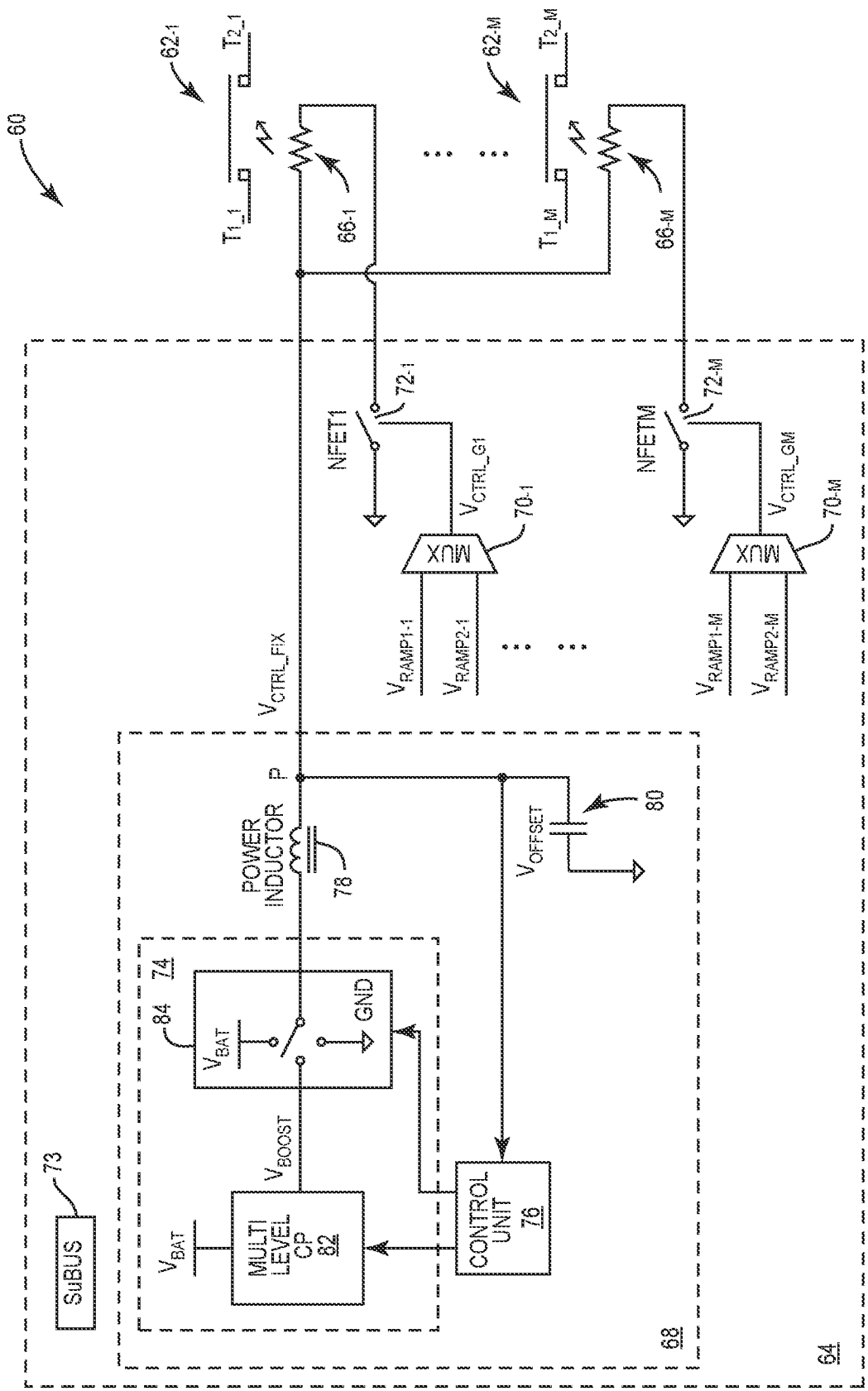
FIG. 6 illustrates another alternative switch system with a switch controller, which controls a number of switches, each based on a dual phase material, according to an embodiment of the present disclosure.

As described above, the control voltage $V_{CTRL}$ generated by the PM unit 18 will vary over time to achieve waveform requirements of the target heat energy for switching on and switching off the phase-change-based switches 42, and will be identical for each phase-change-based switch 42. FIG. 6, on the other hand, illustrates another switch system 60, which utilizes variable resistance instead of variable voltage to achieve waveform requirements for switching on and switching off the phase-change-based switches. The switch system 60 includes a number of phase-change-based switches 62 (e.g., a first phase-change-based switch 62_1, ..., and a $M^{th}$ phase-change-based switch 62_M), a switch controller 64, and a number of heat resistors 66 (e.g., a first heat resistor 66_1, ..., and a $M^{th}$ heat resistor 66_M).

Each phase-change-based switch 62 is a two-terminal (e.g., a corresponding first terminal T1_# and a corresponding second terminal T2_#) switch, and is formed from a chalcogenide material (e.g., germanium-antimony-tellurium, germanium-tellurium, or antimony-tellurium). Each phase-change-based switch 62 is capable of achieving a RF switching speed with a low insertion loss. At an "ON" state (i.e., at the crystalline phase), each phase-change-based switch 62 has a superior low impedance between the first terminal T1_# and the second terminal T2_#, while at an "OFF" state (i.e., at the amorphous phase), each phase-change-based switch 62 has a superior high impedance between the first terminal T1_# and the second terminal T2_#. Each phase-change-based switch 62 is connected to external circuitry (not shown) via the first terminal T1_# and the second terminal T2_#.

Each heat resistor 66 is placed underneath a corresponding phase-change-based switch 62 and configured to transfer electrical energy to heat energy and provide the heat energy to the corresponding phase-change-based switch 62. Each heat resistor 66 may be formed of tungsten and may have a width between 1 μm and 5 μm and a length between 2 μm and 10 μm.

The switch controller 64 is configured to provide electrical energy to the heat resistors 66, so as to close or open the phase-change-based switch 62. In detail, the switch controller 64 includes a non-variable PM unit 68, a number of MUXs 70 (e.g., a first MUX 70_1, ..., and a $M^{th}$ MUX_M), a number of NFET based switches 72 (e.g., a first NPET based switch 72_1, ..., and a $M^{th}$ NFET based switch 72_M), and a SuBUS 73.

Different from the PM unit 18, which provides the control voltage $V_{CTRL}$ varying over time, the non-variable PM unit 68 is configured to provide a fixed control voltage $V_{CTRL\_FIX}$. Herein, the fixed control voltage $V_{CTRL\_FIX}$ does not change over time. The non-variable PM unit 68 includes a multi-level voltage converter 74, a control unit 76, a power inductor 78, and an offset capacitor 80. The multi-level voltage converter 74 has a same configuration as the multi-level voltage converter 28 described above. The multi-level voltage converter 74 includes a multi-level CP 82 and a CP switch structure 84. Herein, the multi-level CP 82 is configured to provide a boosted voltage $V_{BOOST}$ based on a battery voltage $V_{BAT}$, and the CP switch structure 82 is configured to selectively output the boosted voltage $V_{BOOST}$ from the multi-level CP 34, the battery voltage $V_{BAT}$, or zero voltage to the power inductor 78. In a non-limiting example, the boosted voltage $V_{BOOST}$ may be equal to two times or three times the battery voltage $V_{BAT}$ ($V_{BOOST}=2V_{BAT}/3V_{BAT}$).

The control unit 76 is configured to control duty cycles of the multi-level CP 82 to change the value of the boosted voltage $V_{BOOST}$, and configured to control the CP switch structure 84 to select a desired voltage level. The control unit 76 controls the multi-level CP 82 depending on the fixed control voltage $V_{CTRL\_FIX}$ at the voltage port. The control unit 76 may be a microprocessor, a microcontroller, a DSP, a FPGA, or a pulse-width modulation (PWM) analog circuit controller, for example. The power inductor 78 is coupled between the CP switch structure 74 of the multi-level voltage converter 74 and a voltage port P, at which the fixed control voltage $V_{CTRL\_FIX}$ is provided. The maximum value of the fixed control voltage $V_{CTRL\_FIX}$ can reach as high as $3*V_{BAT}$ (i.e., maximum of $V_{BOOST}$). The offset capacitor 80 is coupled between the voltage port P and ground and can be charged up to $V_{BOOST}$ (i.e., maximum 3*Vbat) or discharged to ground.

Notice that the fixed control voltage $V_{CTRL\_FIX}$ does not track any waveform information of the target heat energy required for switching on/off the phase-change-based switches 62. Instead, once the control unit 76 determines a boosting value of the multi-level CP 82 (e.g., $2V_{BAT}$ or $3V_{BAT}$) and a voltage choice of the CP switch structure 84 (e.g., $V_{BOOST}$, $V_{BAT}$, or ground), the fixed control voltage $V_{CTRL\_FIX}$ is fixed over time.

Each NFET based switch 72 and a corresponding heat resistor 66 are coupled in series between ground and the voltage port P. Each MUX 70 is electrically coupled to a gate of a corresponding NFET based switch 72 and configured to provide a gate control voltage $V_{CTRL\_G}$ (e.g., a first gate control voltage $V_{CTRL\_G1}$, ..., or a $M^{th}$ gate control voltage $V_{CTRL\_GM}$) to control the corresponding NFET based switch 72. Each NFET based switch 72 is capable of being fully closed (i.e., a very low resistance), partially closed (i.e., a medium resistance), or fully opened (i.e., a very high resistance) depending on the amplitude of the corresponding gate control voltage $V_{CTRL\_G}$. As such, each gate control voltage $V_{CTRL\_G}$ can change a resistance value between the voltage port P and ground. Since the fixed control voltage $V_{CTRL\_FIX}$ has a fixed value over time, current flowing through each heat resistor 66, and consequently heat generated by each heat resistor 66, can change according on the variation of the corresponding control voltage $V_{CTRL\_G}$. Therefore, each phase-change-based switch 62 is capable of switching on and switching off by the variation of the corresponding control voltage $V_{CTRL\_G}$.

Herein, each gate control voltage $V_{CTRL\_G}$ is selected from a corresponding ramp waveform pair $V_{RAMP1}$ and $V_{RAMP2}$ (e.g., a first ramp waveform pair $V_{RAMP1\_1}$ and $V_{RAMP2\_1}$, ..., or a $M^{th}$ ramp waveform pair $V_{RAMP1\_M}$ and $V_{RAMP2\_M}$). Each ramp waveform pair contains waveform information of the target heat energy required for switching on and switching off the corresponding phase-change-based switch 62. Therefore, each gate control voltage $V_{CTRL\_G}$ also contains the waveform information of the target heat energy required for switching on or switching off the corresponding phase-change-based switch 62. By adjusting each ramp waveform pair $V_{RAMP1}$ and $V_{RAMP2}$, and consequently adjusting each gate control voltage $V_{CTRL\_G}$, the waveform requirements for switching on/off the corresponding phase-change-based switch 62 can be achieved.

Each ramp waveform pair may be the same or different depending on the corresponding phase-change-based switch 62. In addition, by utilizing multiple MUXs 70, different phase-change-based switches 62 may perform different switching operations at a same time. For instance, the first MUX 70_1 selects $V_{RAMP1\_1}$ for the first phase-change-based switch 62_1, and the first phase-change-based switch 62_1 turns from "ON" to "OFF". Simultaneously, the $M^{th}$ MUX 70_M selects $V_{RAMP2\_M}$ for the $M^{th}$ phase-change-based switch 62_M, and the $M^{th}$ phase-change-based switch 62_M turns from "OFF" to "ON".

The SuBUS 73 is configured to provide programmability to the switch controller 64 via a serial interface. The SuBUS 73 might be a single-wire bus. In one embodiment, each MUX 70 can be programmed by the SuBUS 73 (e.g., programming each MUX 70 to select a certain ramp waveform as a gate control voltage at a certain time).

In some applications, there might be only one phase-change-based switch 62 (instead of multiple phase-change-based switches 62) in the switch system 60. Accordingly, there will be only one heat resistor 66 (instead of multiple heat resistors 66), and one MUX 70 (instead of multiple MUXs 70) and one NFET based switch 72 (instead of multiple NFET based switches 72) in the switch controller 64 (not shown).

Note that in all embodiments, the offset capacitor 32/80 and capacitors in the multi-level CP 34/82 can be precharged before the switch controller 14/44/44A/62 provides electrical energy to the heat resistor(s) 16/46/66, so as to reduce switching delays for the phase-change-based switch 12/42/62.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   at least one heat resistor;
   a power management (PM) unit configured to provide a control voltage at a voltage port, which is coupled to the at least one heat resistor; and
   at least one phase-change-based switch, wherein:
   the at least one heat resistor is underneath the at least one phase-change-based switch, and configured to generate heat energy from the control voltage and provide the heat energy to the at least one phase-change-based switch, wherein the at least one heat resistor is not electrically connected to the at least one phase-change-based switch;
   the at least one phase-change-based switch is capable of being switched on and off by switching between a crystalline phase and an amorphous phase based on the heat energy provided by the at least one heat resistor; and
   the control voltage provided by the PM unit contains waveform information of target heat energy required for switching on and off the at least one phase-change-based switch.

2. The apparatus of claim 1 further comprising a multiplexer (MUX), which is configured to select either a first ramp waveform or a second ramp waveform as a target voltage, wherein:
   the target voltage is provided to the PM unit, and the control voltage is provided based on the target voltage;
   the first ramp waveform corresponds to switching on the at least one phase-change-based switch, and contains the waveform information of the target heat energy required for switching on the at least one phase-change-based switch; and
   the second ramp waveform corresponds to switching off the at least one phase-change-based switch, and contains the waveform information of the target heat energy required for switching off the at least one phase-change-based switch.

3. The apparatus of claim 2 wherein the PM unit includes a tracking amplifier, a control unit, a multi-level voltage converter, and a power inductor, wherein:
   the tracking amplifier is configured to receive the target voltage, and configured to generate a tracked voltage based on the target voltage, wherein the control voltage is related to the tracked voltage;
   the multi-level voltage converter includes a multi-level charge pump (CP) configured to receive a battery voltage and generate a boosted voltage higher than the battery voltage, and a CP switch structure coupled between the multi-level CP and the power inductor;
   the control unit is configured to control a value of the boosted voltage generated by the multi-level CP, and configured to control the CP switch structure to provide the boosted voltage from the multi-level CP, the battery voltage, or zero voltage to the power inductor; and
   the power inductor is coupled between the CP switch structure of the multi-level voltage converter and the voltage port.

4. The apparatus of claim 3 wherein the control unit is one of a group consisting of a microprocessor, a microcontroller, a digital signal processor (DSP), and a field programmable gate array (FPGA).

5. The apparatus of claim 3 wherein:
   the PM unit further comprises an offset capacitor, which is coupled between the tracking amplifier and the voltage port; and
   the control voltage at the voltage port is equal to a summation of the tracked voltage generated by the tracking amplifier and an offset voltage across the offset capacitor.

6. The apparatus of claim 5, wherein:
   the control unit is configured to control the multi-level CP by comparing the tracked voltage from the tracking amplifier and the control voltage at the voltage port.

7. The apparatus of claim 5 wherein:
   the boosted voltage is equal to up to three times the battery voltage; and
   the offset voltage is equal to up to two times the battery voltage.

8. The apparatus of claim 7 wherein:
   the tracking amplifier is powered by the boosted voltage; and
   the control voltage is capable of having a maximum value up to five times the battery voltage.

9. The apparatus of claim 1 wherein the at least one phase-change-based switch is formed from a chalcogenide material.

10. The apparatus of claim 9 wherein the at least one phase-change-based switch is formed from germanium-antimony-tellurium, germanium-tellurium, or antimony-tellurium.

11. The apparatus of claim 1 wherein:
    the at least one phase-change-based switch at the crystalline phase has a first impedance, and the at least one phase-change-based switch at the amorphous phase has a second impedance; and
    the second impedance is at least 20,000,000 times larger than the first impedance.

12. The apparatus of claim 1 wherein:
    the at least one heat resistor is formed of tungsten; and
    the at least one heat resistor has a width between 1 µm and 5 µm and a length between 2 µm and 10 µm.

13. The apparatus of claim 1 further comprising a plurality of field-effect transistor (FET) based switches, wherein:
    the at least one heat resistor includes a plurality of heat resistors;
    the at least one phase-change-based switch includes a plurality of phase-change-based switches, wherein each of the plurality of heat resistors is underneath a corresponding one of the plurality of phase-changebased switches, and configured to generate heat energy from the control voltage and provide the heat energy to the corresponding one of the plurality of phase-change-based switches; and the plurality of FET based switches is configured to selectively provide the control voltage to certain ones of the plurality of heat resistors.

14. The apparatus of claim 13 wherein each of the plurality of FET based switches is coupled in series with a corresponding one of the plurality of heat resistors.

15. The apparatus of claim 14 wherein:
each of the plurality of FET based switches is a P-channel FET (PFET) based switch; and
each of the plurality of FET based switches is coupled between the voltage port and a corresponding heat resistor.

16. The apparatus of claim 14 wherein:
each of the plurality of FET based switches is a N-channel FET (NFET) based switch; and
each of the plurality of FET based switches is coupled between a corresponding heat resistor and ground.

17. The apparatus of claim 13 further comprising a serial bus (SuBUS), which is configured to program when to close or open certain ones of the plurality of FET based switches.

18. The apparatus of claim 1 wherein each waveform of the target heat energy required for switching on or off the at least one phase-change-based switch has a duration of 0.5 μs to 2 μs.

19. An apparatus comprising:
at least one heat resistor;
a non-variable power management (PM) unit configured to provide a control voltage at a voltage port that is coupled to the at least one heat resistor, wherein the control voltage is fixed over time;
at least one phase-change-based switch, wherein:
the at least one heat resistor is underneath the at least one phase-change-based switch, and configured to generate heat energy from the control voltage and provide the heat energy to the at least one phase-change-based switch; and
the at least one phase-change-based switch is capable of being switched on and off by switching between a crystalline phase and an amorphous phase based on the heat energy provided by the at least one heat resistor; and
at least one N-channel field-effect transistor (NFET) based switch coupled between the at least one heat resister and ground, wherein a gate of the at least one NFET based switch is controlled by a gate control voltage, which contains waveform information of target heat energy required for switching on and off the at least one phase-change-based switch.

20. The apparatus of claim 19 further comprising at least one multiplexer (MUX), which is configured to select either a first ramp waveform or a second ramp waveform as the gate control voltage, wherein:
the first ramp waveform corresponds to switching on the at least one phase-change-based switch, and contains the waveform information of the target heat energy required for switching on the phase-change-based switch; and
the second ramp waveform corresponds to switching off the phase-change-based switch, and contains the waveform information of the target heat energy required for switching off the at least one phase-change-based switch.

21. The apparatus of claim 20 wherein the non-variable PM unit includes a control unit, a multi-level voltage converter, and a power inductor, wherein:
the multi-level voltage converter includes a multi-level charge pump (CP) configured to receive a battery voltage and generate a boosted voltage higher than the battery voltage, and a CP switch structure coupled between the multi-level CP and the power inductor;
the control unit is configured to control a value of the boosted voltage generated by the multi-level CP, and configured to control the CP switch structure to provide the boosted voltage from the multi-level CP, the battery voltage, or zero voltage to the power inductor; and
the power inductor is coupled between the CP switch structure of the multi-level voltage converter and the voltage port.

22. The apparatus of claim 21 wherein the control unit is one of a group consisting of a microprocessor, a microcontroller, a digital signal processor (DSP), a field programmable gate array (FPGA), and a pulse-width modulation (PWM) analog circuit controller.

23. The apparatus of claim 21 wherein the non-variable PM unit further comprises an offset capacitor coupled between the voltage port and ground.

24. The apparatus of claim 21, wherein the control unit is configured to control the multi-level CP depending on the control voltage at the voltage port.

25. The apparatus of claim 21 wherein:
the boosted voltage is equal to up to three times the battery voltage; and
the control voltage is equal to up to three times the battery voltage.

26. The apparatus of claim 19 wherein the at least one phase-change-based switch is formed from a chalcogenide material.

27. The apparatus of claim 26 wherein the at least one phase-change-based switch is formed from germanium-antimony-tellurium, germanium-tellurium, or antimony-tellurium.

28. The apparatus of claim 19 wherein:
the at least one phase-change-based switch at the crystalline phase has a first impedance, and the at least one phase-change-based switch at the amorphous phase has a second impedance; and
the second impedance is at least 20,000,000 times larger than the first impedance.

29. The apparatus of claim 19 wherein:
the at least one heat resistor is formed of tungsten; and
the at least one heat resistor has a width between 1 μm and 5 μm and a length between 2 μm and 10 μm.

30. The apparatus of claim 19 wherein:
the at least one heat resistor includes a plurality of heat resistors;
the at least one phase-change-based switch includes a plurality of phase-change-based switches, wherein each of the plurality of heat resistors is underneath a corresponding one of the plurality of phase-change-based switches, and configured to generate heat energy from the control voltage and provide the heat energy to the corresponding one of the plurality of phase-change-based switches; and
the at least one NFET based switch includes a plurality of NFET based switches, each of which is coupled between a corresponding one of the plurality of heat resistors and ground, wherein:
a gate of each of the plurality of NFET based switches is controlled by a corresponding gate control voltage, such that a resistance value of each of the plurality of NFET based switches is controlled; and each gate control voltage contains waveform information of target heat energy required for switching on and off the corresponding one of the plurality of phase-change-based switches.

31. The apparatus of claim 30 further comprising a plurality of MUXs, each of which is configured to provide one gate control voltage for each of the plurality of NFET based switches, wherein:

each gate control voltage is selected from a corresponding ramp waveform pair; and each ramp waveform pair contains waveform information of the target heat energy required for switching on and switching off a corresponding one of the plurality of phase-change-based switches.

32. The apparatus of claim 31 wherein the ramp waveform pair corresponding to each of the plurality of phase-change-based switches is the same.

33. The apparatus of claim 31 wherein the ramp waveform pair corresponding to each of the plurality of phase-change-based switches is different.

34. The apparatus of claim 31 wherein the plurality of phase-change-based switches is capable of performing different switching operations at a same time.

35. The apparatus of claim 31 further comprising a serial bus (SuBUS), which is configured to program each of the plurality of MUXs to determine when a certain ramp waveform is selected as a corresponding gate control voltage.

\* \* \* \* \*